(12) United States Patent
Cheng et al.

(10) Patent No.: US 8,450,190 B2
(45) Date of Patent: May 28, 2013

(54) FABRICATION OF GAN SUBSTRATE BY DEFECT SELECTIVE PASSIVATION (75) Inventors: Yuh-Jen Cheng, Taipei (TW); Ming-Hua Lo, Jhongli (TW); Hao-chung Kuo, Hjubei (TW)

(73) Assignee: Academia Sinica, Taipei (TW)

( * ) Notice: Subject to any disclaimer, the term of this patent is extended or adjusted under 35 U.S.C. 154(b) by 319 days.

(21) Appl. No.: 12/729,698

(22) Filed: Mar. 23, 2010

(65) Prior Publication Data

US 2011/0233519 A1    Sep. 29, 2011

(51) Int. Cl.
*H01L 21/20* (2006.01)
*H01L 21/36* (2006.01)
*H01L 21/31* (2006.01)
*H01L 21/469* (2006.01)
*H01L 21/302* (2006.01)

(52) U.S. Cl.
USPC ............ 438/478; 438/758; 438/689; 438/702

(58) Field of Classification Search
USPC ............... 438/46, 478, 481, 41, 341, 117, 44, 438/38, 114, 492, 493, 496, 494, 498, 689, 438/694, 699, 700, 702, 703, 758, 761
See application file for complete search history.

(56) References Cited

U.S. PATENT DOCUMENTS

| 7,459,380 B2 | 12/2008 | Bour et al. |
| 7,560,364 B2 | 7/2009 | Bour et al. |
| 2002/0022290 A1 | 2/2002 | Kong et al. |
| 2002/0168844 A1 * | 11/2002 | Kuramoto et al. ............ 438/604 |

OTHER PUBLICATIONS

Lo, M.H., et al., "Defect selective passivation in GaN epitaxial growth and its application to light emitting diodes," Appl. Phys. Lett., 95(21):211103, Nov. 2009. (3 pages).

* cited by examiner

*Primary Examiner* — Chuong A. Luu
(74) *Attorney, Agent, or Firm* — Perkins Coie LLP (57) ABSTRACT

Defect selective passivation in semiconductor fabrication for reducing defects.

23 Claims, 7 Drawing Sheets

FABRICATION OF GAN SUBSTRATE BY DEFECT SELECTIVE PASSIVATION

BACKGROUND

This document relates to semiconductor structures, devices and fabrication techniques.

Semiconductor structures may include defects due to various factors, such as mismatch in properties of two different materials that are adjacent to and interface with each other. Common defects found in strained semiconductor film stacks due to differences in crystalline structures in the film stacks include threading dislocations (TDs) that often appear on surfaces of the strained semiconductor film stacks and propagate through film stacks in GaN and other semiconductor materials.

Threading dislocations and other defects in semiconductor structures can adversely affect the device performances and reliability. Various efforts have been made in reducing the threading dislocation density in semiconductor structures.

SUMMARY

Examples and implementations of defect selective passivation are described.

In one implementation, a method for semiconductor fabrication includes growing a first semiconductor layer of a first semiconductor material on a substrate that is made of a substrate material different from the first semiconductor material; etching a top surface of the first semiconductor layer to create one or more etch pits on the top surface extending into the first semiconductor layer, wherein one or more defects are present underneath each etch pit inside the first semiconductor layer; depositing a passivation layer of a passivation material on the top surface to cover exposed areas of the top surface and the one or more etch pits to cover space above the one or more defects in each etch pit; thinning down the passivation layer to remove some of the passivation material to expose at least part of the top surface while leaving the space above the one or more defects in each etch pit covered by the passivation layer; and, after the thinning down, growing the first semiconductor material or a different semiconductor material compatible with the first semiconductor material over exposed areas of the first semiconductor layer to form a second semiconductor layer that covers the top surface and the one or more etch pits which are covered by the passivation layer to block extension of a defect in the first semiconductor layer into the second semiconductor layer.

In another implementation, a method for semiconductor fabrication includes growing a first semiconductor layer of a first semiconductor material that includes GaN on a substrate that is made of a substrate material different from the first semiconductor material; applying a chemical wet etching process to etch a top surface of the first semiconductor layer in a molten or aqueous etching solution to create one or more etch pits on the top surface extending into the first semiconductor layer, wherein one or more defects are present underneath each etch pit inside the first semiconductor layer; depositing a passivation layer of a passivation material on the top surface to cover exposed areas of the top surface and the one or more etch pits to cover space above the one or more defects in each etch pit; thinning down the passivation layer to remove some of the passivation material to expose at least part of the top surface while leaving the space above the one or more defects in each etch pit covered by the passivation layer; after the polishing, growing the first semiconductor material or a different semiconductor material compatible with the first semiconductor material on exposed areas of the first semiconductor layer to form a second semiconductor layer that covers the top surface and the one or more etch pits which are covered by the passivation layer to block extension of a defect in the first semiconductor layer into the second semiconductor layer; and forming one or more additional semiconductor layers over the second semiconductor layer.

In yet another implementation, a semiconductor device includes a first semiconductor layer of a semiconductor material that includes semiconductor defects, the first semiconductor layer including a first surface, etch pits on the first surface extending into the first semiconductor layer and a passivation material covering etch pits and one or more defects underneath each etch pit inside the first semiconductor layer; a second semiconductor layer of the same semiconductor material or a different compatible semiconductor material that is epitaxially grown on the first surface of the first semiconductor layer and over the one or more etch pits; and one or more additional semiconductor layers formed over the second semiconductor layer and patterned to form one or more semiconductor device structures.

These and other implementations are described in greater detail in the drawings, the description and the claims.

DETAILED DESCRIPTION

In various semiconductor structures and devices, different semiconductor materials with different crystalline structures are often placed next to one another. This interfacing of two different crystalline semiconductor materials leads to undesired threading dislocations and other defects. Examples of semiconductor structures in this document are Group III-V semiconductor structures based on elements in Group IIIB, such as boron (B), aluminum (Al), gallium (Ga), indium (In), and thallium (Tl), and elements in Group V, such as nitrogen (N), phosphorus (P), arsenic (As), antimony (Sb), and bismuth (Bi). The Group III-V semiconductor structures, notably, Group III-nitride structures, have been widely used for light emission and optical gain media in the UV and blue to green spectral ranges for various applications, such as optoelectronics and microelectronics device applications including light emitting diodes, laser diodes, high electron mobility transistors, and others. The basic building platform for such semiconductor structures are III-nitride semiconductor substrates, e.g., GaN substrates. It is desirable to provide Group III-V semiconductor substrates with a large area and a low defect density. The GaN substrates and GaN devices are used as example below to illustrate the designs and fabrication techniques, and semiconductors structures that can be applied to other Group III-V semiconductor structures.

One class of commonly-used growth methods for GaN is vapor-phase synthesis, for example, metalorganic chemical vapor deposition (MOCVD), hydride vapor-phase epitaxy (HVPE), molecular-beam epitaxy (MBE), and metal-organic chloride (MOC) vapor-phase epitaxy. Large III-nitride substrates are not readily available and, as such, the III-nitride semiconductor devices have often been heteroepitaxially grown upon different substrate templates, for example, sapphire substrate templates due to stable material properties of sapphire. However, the lattice constant mismatch between GaN and sapphire is relatively large and causes dislocation defects in the GaN-Sapphire structure. In addition, the thermal expansion coefficient mismatch between GaN and sapphire substrates also introduces stress into the GaN thin film during the growth process and this thermal-induced stress, in turn, causes additional dislocation defects when the substrate temperature is cycled during the growth process. These and other factors pose a significant challenge to growing a low defect crystal material. For example, the dislocation defect density in GaN-Sapphire structures can be as large as $10^{8-10}$ $cm^{-2}$ and is a critical factor affecting the performance of the devices subsequently fabricated on top of such structures. It desirable to reduce the defect density for better device performance.

Fabrication techniques and semiconductor structures described in this document can be used to provide self-aligned defect selective passivation to reduce dislocation defects. Notably, the present fabrication techniques can be used to the dislocation defects without the need of the photolithography based on photoresist masks and exposure of the photoresist.

Figure 1:
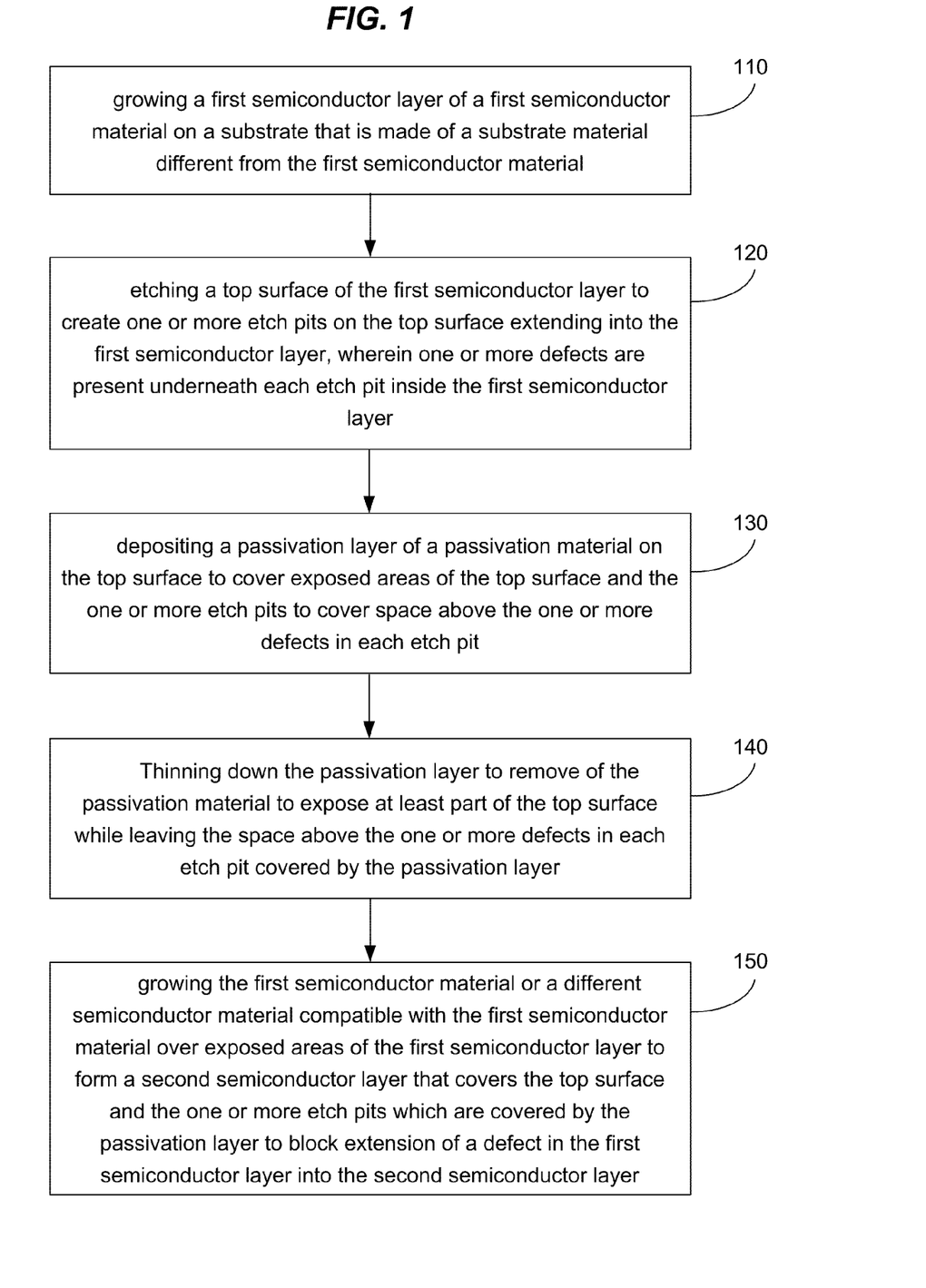
FIG. 1 shows an example of a method for semiconductor fabrication to reduce defects based on selective etching and passivation at etch pits.

FIG. 1 illustrates a method for semiconductor fabrication to reduce defects by including, at least, the processing steps 110-150. A first semiconductor layer of a first semiconductor material is grown on a substrate that is made of a substrate material different from the first semiconductor material (110). The difference in material between the substrate and the first semiconductor layer grown on the substrate renders the substrate a heteroepitaxial substrate. The top surface of the first semiconductor layer is etched to create one or more etch pits on the top surface extending into the first semiconductor layer (120). One or more defects are present underneath each etch pit inside the first semiconductor layer. This etching process is spatially selective to pick only locations on the top surface where there are underlying defects. Next, a passivation layer of a passivation material is deposited on the top surface to cover exposed areas of the top surface and the one or more etch pits to cover space above the one or more defects in each etch pit (130). The passivation material is a material on which crystalline growth of a semiconductor material is inhibited. Therefore, the deposited passivation material prevents crystalline growth of the first semiconductor material or a similar semiconductor material with a crystalline structure compatible with that of the first semiconductor. The passivation layer is subsequently thinned down or partially removed to expose at least part of the top surface while leaving the space above the one or more defects in each etch pit covered by the passivation layer (140). This processing can be achieved by various material removal techniques, including polishing such as chemical-mechanical polishing (CMP), or etching such as inductively charged plasma (ICP) etching. After the thinning process, the first semiconductor material or a similar semiconductor material is again grown over exposed areas of the first semiconductor layer to form a second semiconductor layer that covers the top surface and the one or more etch pits which are covered by the passivation layer (150).

In this process, the passivation layer left inside each etch pit after the thinning step (140) blocks extension of a defect in the first semiconductor layer into the second semiconductor layer. Therefore, the exposed surface after the thinning process provides a new surface that is largely made of the defect-free first semiconductor material and has isolated areas with the passivation material covering the underlying defects. This new surface provides the defect-free first semiconductor material surface for the subsequent growth of the second semiconductor layer to provide either a perfect material match if the second semiconductor layer is made of the first semiconductor material or a compatible material match if the second semiconductor material is made of a different semiconductor material that has a crystalline structure compatible with the first semiconductor material. In both cases, the overall defects are reduced in comparison to growing the first semiconductor layer over the substrate that is made of the substrate material different from the first semiconductor material.

The second semiconductor material can be a material that is different from the first semiconductor material with compatible material properties. For example, if the first semiconductor material is GaN, examples of different materials for the second semiconductor layer with compatible material properties for the regrown second material layer include $In_xGa_{1-x}N$, or other III-nitride material.

The above fabrication method may also include additional processing steps. For example, after formation of the second semiconductor layer (150), one or more additional semiconductor layers can be formed over the second semiconductor layer. The one or more additional semiconductor layers can be patterned to form semiconductor device structures, such as multiple quantum well structures that emit light under electrical excitation. The substrate material for the template substrate can be implemented by various materials depending on the requirements of specific device applications. Examples for the substrate material are sapphire, silicon carbide, silicon, gallium arsenide, lithium gallate, or zinc oxide. Various III-V materials can be used for the first and second semiconductor layers in FIG. 1. For example, III-nitride materials can be binary compounds AlN and InN, and ternary compounds AlGaN, GaInN, and AlInN, and the quaternary compound AlGaInN. The III-V semiconductor material for the first semiconductor layer and the second semiconductor layer can be grown by various growth techniques, including vapor-phase growth techniques, MOCVD, HVPE, MBE) and MOC vapor-phase epitaxy. The etching of top surface of the first semiconductor layer may use a chemical wet etching process by submerging the structure in a molten or aqueous etching solution, which can be a solution of KOH, $H_2SO_4$, $H_3PO_4$, HCl, or a mixture of two or more of KOH, $H_2SO_4$, $H_3PO_4$ and HCl. The passivation material that inhibits the growth of the crystalline first semiconductor material or the similar semiconductor family material can be an amorphous material, such as various oxides and nitrides. Specific examples for the passivation material include $SiO_2$, $Si_3N_4$, $TiO_2$, $Ta_2O_5$, $HfO_2$, $MgO_2$, or $MgF_2$. In some implementations, the processing steps 120-150 may be repeated to grow additional semiconductor layers over the second semiconductor layer.

Figure 2A:
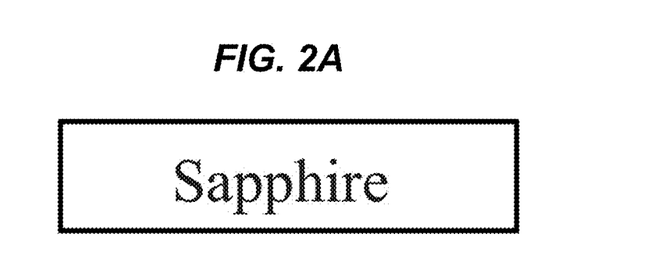
FIGS. 2A-2G show one example of a fabrication process based on the method in FIG. 1.
Figure 2B:
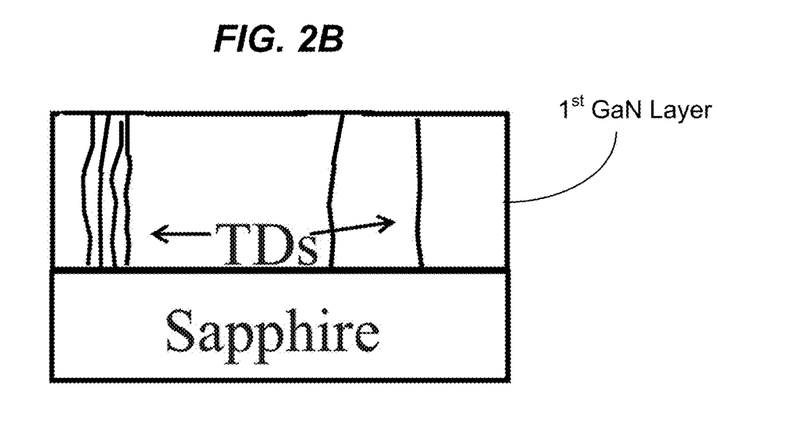
Figure 2C:
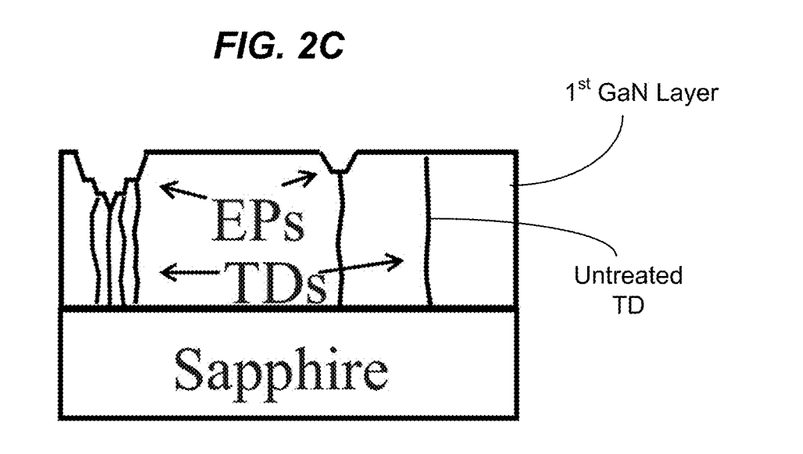

As a specific example, FIGS. 2A-2G show an example of the above fabrication method for a semiconductor device based on a GaN substrate formed on a sapphire substrate template. FIG. 2A shows that a sapphire substrate, e.g., a (0001) sapphire template, is prepared for growing GaN on top of it. FIG. 2B shows that a first initial layer of GaN is grown on the sapphire substrate. This first initial GaN layer can be, for example, a 30-nm low temperature GaN nucleation layer followed by a 2 μm GaN buffer layer using, e.g., the low pressure metalorganic chemical vapor deposition (MOCVD). The thickness of this first GaN layer, which is 30 nm in this example, is controlled to be at a desired value. As illustrated, threading dislocations (TDs) are present at the interface between the first GaN layer and the sapphire and extend inside the first GaN layer. Continuous growth of this first GaN layer would lead these TDs to propagate throughout the GaN layer. To prevent this propagation of TDs, the growth of GaN is terminated after the selected thickness of the first GaN layer is reached. Next, the resultant first GaN layer is treated with a selective etching process by immersing it in a molten or aqueous etching solution at a high temperature, e.g., a molten KOH at 280-400° C. for a desired duration, e.g., 5-15 minutes. The molten KOH selectively etches defect sites and forms hexagonal etch pits (EPs) on the top GaN surface that is exposed to the molten KOH solution as illustrated in FIG. 2C. There could be one or several threading dislocations under each etch pit. Each etch pit is on the top GaN surface and extends into the first GaN layer to expose the top end of one or more threading dislocations underneath each etch pit. Certain threading dislocations, however, may not extend all the way to the top GaN surface and thus may not be exposed by the selective etching. As an example, the threading dislocation shown on the far right hand in FIG. 2B ends at a location below the top GaN surface and is a stand-alone threading dislocation that is not adjacent to another threading dislocation. This stand-alone TD is shown to remain hidden after the selective etching.

Figure 2D:
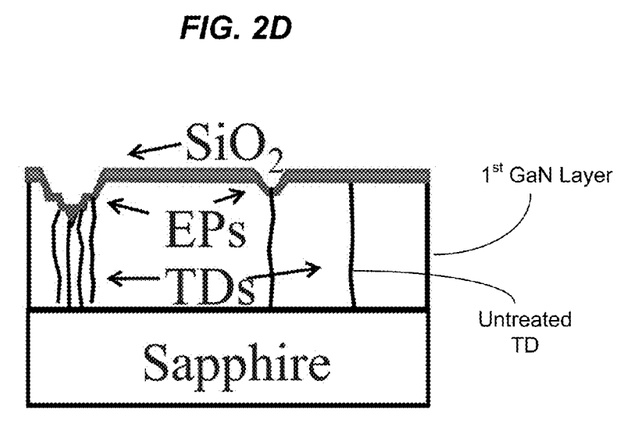
Figure 2E:
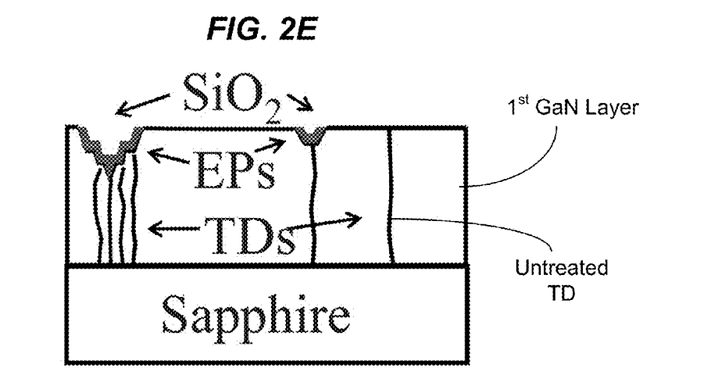
Figure 2F:
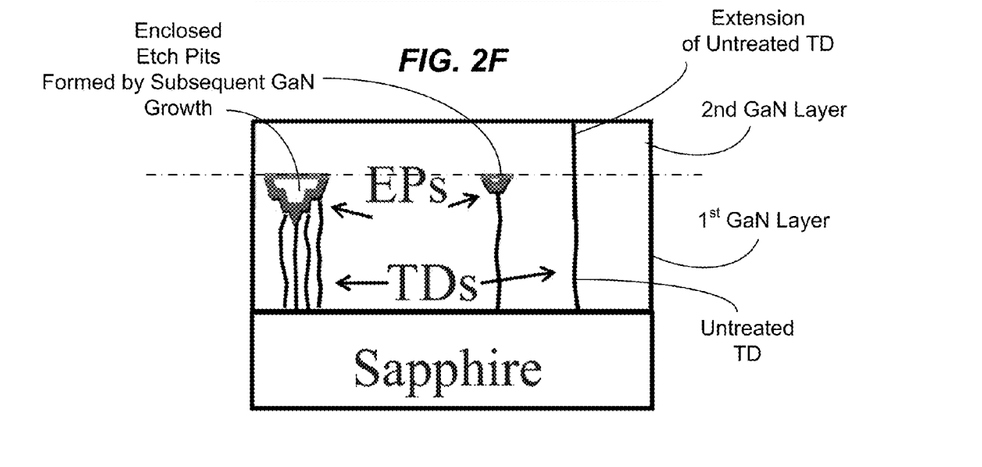

Next, a passivation layer is formed on the top GaN surface to cover exposed areas of the top GaN surface and the one or more etch pits to cover space above the one or more defects in each etch pit. In this specific example as shown in FIG. 2D, a 0.5-um $SiO_2$ film is deposited on the etched surface as the passivation layer by plasma enhanced chemical vapor deposition (PECVD). Other materials on which GaN crystal growth can not occur can also be used. The $SiO_2$ thin film on the flat surface area of the top GaN surface is removed by chemical mechanical polishing (CMP) to thin down $SiO_2$ till the top GaN surface is exposed, leaving only $SiO_2$ at the etch pits as illustrated in FIG. 2E. This thinning down step can alternatively be achieved by other etching process, for example using inductively charged plasmas (ICP) etching, inductively charged plasma reactive ion etching (ICP-RIE) or the like. The $SiO_2$ fillings at etch pits act as defect passivation to block the continuous propagation of threading dislocations in the subsequent epitaxial re-growth of GaN. The exposed GaN flat surface provides the seed layer for epitaxial growth of GaN, which grows in both vertical and lateral directions to cover over the $SiO_2$ passivated etch pits. As shown in FIG. 2F, a second GaN layer is subsequently grown on top of the structure shown in FIG. 2E. The combination of the inhibition of the GaN growth of the passivation fillings in etch pits and the lateral and vertical growth of the GaN from the seeding surface of GaN around each etch pit leads to formation of enclosed cavities at sites of etch pits. Therefore, the passivation filling in each etch pit blocks further extension of a defect in the first GaN layer into the second GaN layer. Notably, the far right stand-alone threading dislocation in FIG. 2F, which is not exposed by the selective etching, is not treated by the $SiO_2$ passivation layer. As such, the epitaxial growth of the second GaN layer may cause this untreated, stand-alone threading dislocation to propagate and extend into the second GaN layer. Therefore, the above selective etching and the passivation processes can significantly reduce the defect density in the second GaN layer while some defects may still be present in the second GaN layer. In some implementations, the above selective etching may be applied to the second GaN layer and another passivation layer may be deposited after the selective etching of the second GaN layer to allow for epitaxial growth of a third GaN layer on top of the second GaN layer to further reduce the defect density in the third GaN layer.

The $SiO_2$ passivation fillings in the etch pits after the selective etching and removal of the $SiO_2$ passivation layer from the top flat GaN surface effectuate a spatially patterned $SiO_2$ mask in which $SiO_2$ passivation fillings are spatially aligned with underlying TDs that are exposed by the selective etching. Notably, this spatially patterned $SiO_2$ mask is formed without using photolithography patterning and is self-aligned at TD etch pits created by defect selective etching. The chemical mechanical polishing for exposing GaN at locations other than the etch pits ensures a flat surface at the exposed GaN locations for GaN regrowth.

Figure 2G:
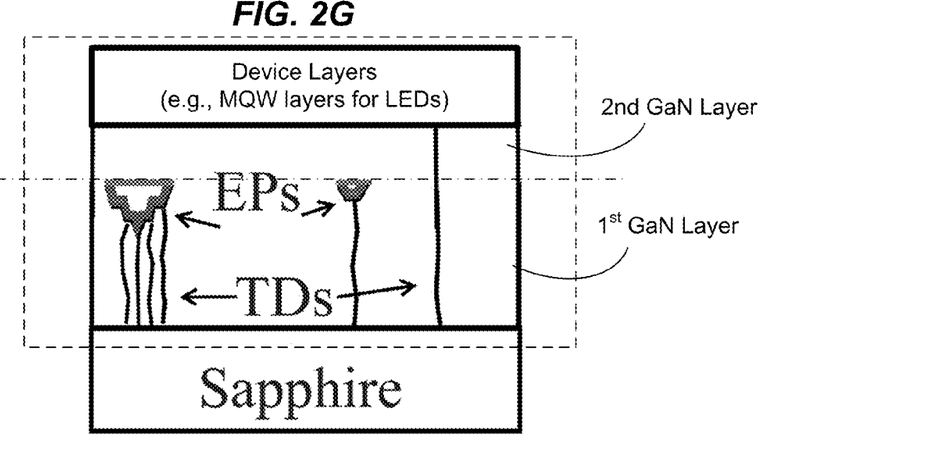

The second GaN layer in FIG. 2F has less defects than the first GaN layer directly formed on top of the sapphire substrate and provides a high quality platform for fabricating semiconductor devices. As illustrated in FIG. 2G, one or more additional semiconductor layers can be formed over the second GaN layer and patterned to form one or more semiconductor device structures. These additional device layers can be configured to provide various devices and may be, e.g., multiple quantum well (MQW) layers that emit light as lasers or LEDs. Therefore, the semiconductor device in FIG. 2G has a structure with enclosed etch pits in the first GaN layer. The structure of this device includes a first semiconductor layer having a first surface and made of a III-V material (e.g., a III-nitride material such as GaN), a second semiconductor layer of the same family semiconductor material as the first semiconductor layer that is epitaxially grown on the first surface of the first semiconductor layer, and one or more additional semiconductor layers formed over the second semiconductor layer and patterned to form one or more semiconductor device structures. The first semiconductor layer includes semiconductor defects, etch pits on the first surface extending into the first semiconductor layer and a passivation material covering etch pits and one or more defects underneath each etch pit inside the first semiconductor layer. The first semiconductor layer (e.g., the first GaN layer) is grown on the sapphire substrate template. In the final device, the sapphire substrate may be removed to have a device shown in the dotted box that is free of the sapphire substrate. In other implementations, the sapphire substrate may remain as part of the final device.

Tests have been conducted on GaN substrate samples on sapphire substrates based on above fabrication techniques for reducing the threading dislocations.

Figure 3:
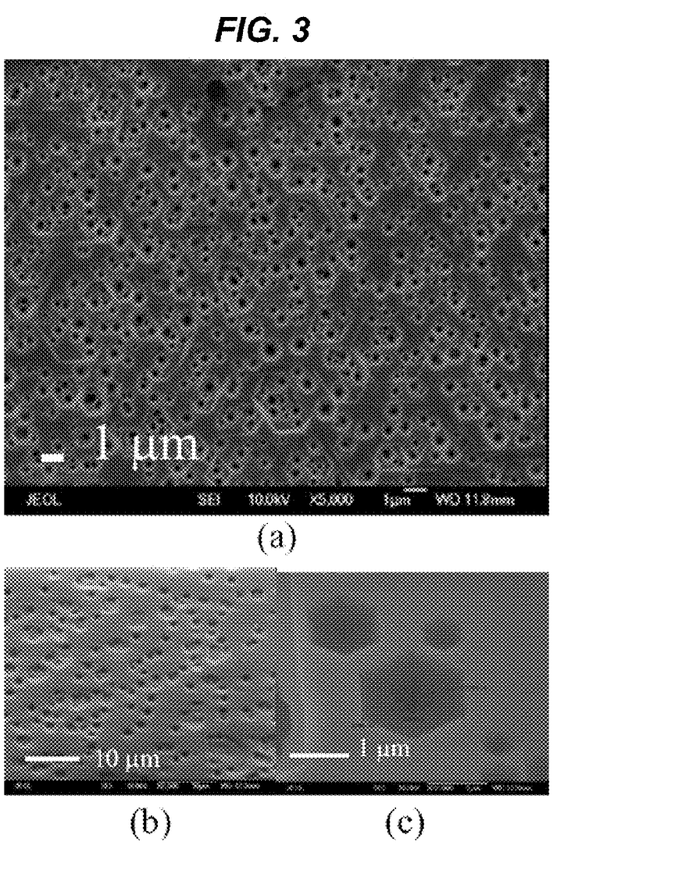
FIGS. 3, 4, 5 and 6 show images and measurements of GaN samples based on the method in FIG. 1.

FIG. 3 shows the surface scanning electron microscope (SEM) images of a GaN sample. FIG. 3(a) shows the SEM image of the GaN surface after the selective etching corresponding to the processing step in FIG. 2C. The random distribution of hexagonal pits after molten KOH etching are shown. The etched crystal planes are mostly [11-21], [11-22], [10-11] facets. Aside from individual hexagonal pits, there are often several pits clustered together. The etch pit density counting all the individual pits is about $5 \times 10^8$ $cm^{-2}$. The deposited $SiO_2$ thin film follows the etched pit topography as shown in FIG. 3(b) corresponding to the processing step in FIG. 2D. After chemical mechanical polishing process, only SiO2 in etched pits are left as shown in FIG. 3(c) corresponding to the processing in FIG. 2E. Small pits are filled with SiO2. For large pits, SiO2 only fills the side walls leaving a void in the center above the SiO2 fillings. The subsequent MOCVD epitaxial over growth covers the whole wafer with flat surface. A LED structure with 2 μm Si-doped n-GaN, ten pairs of InGaN/GaN multiple quantum wells (WQWs), and a 30 nm Mg-doped p-GaN are grown on the template. The QW emission wavelength of this device is at 425 nm.

Figure 4:
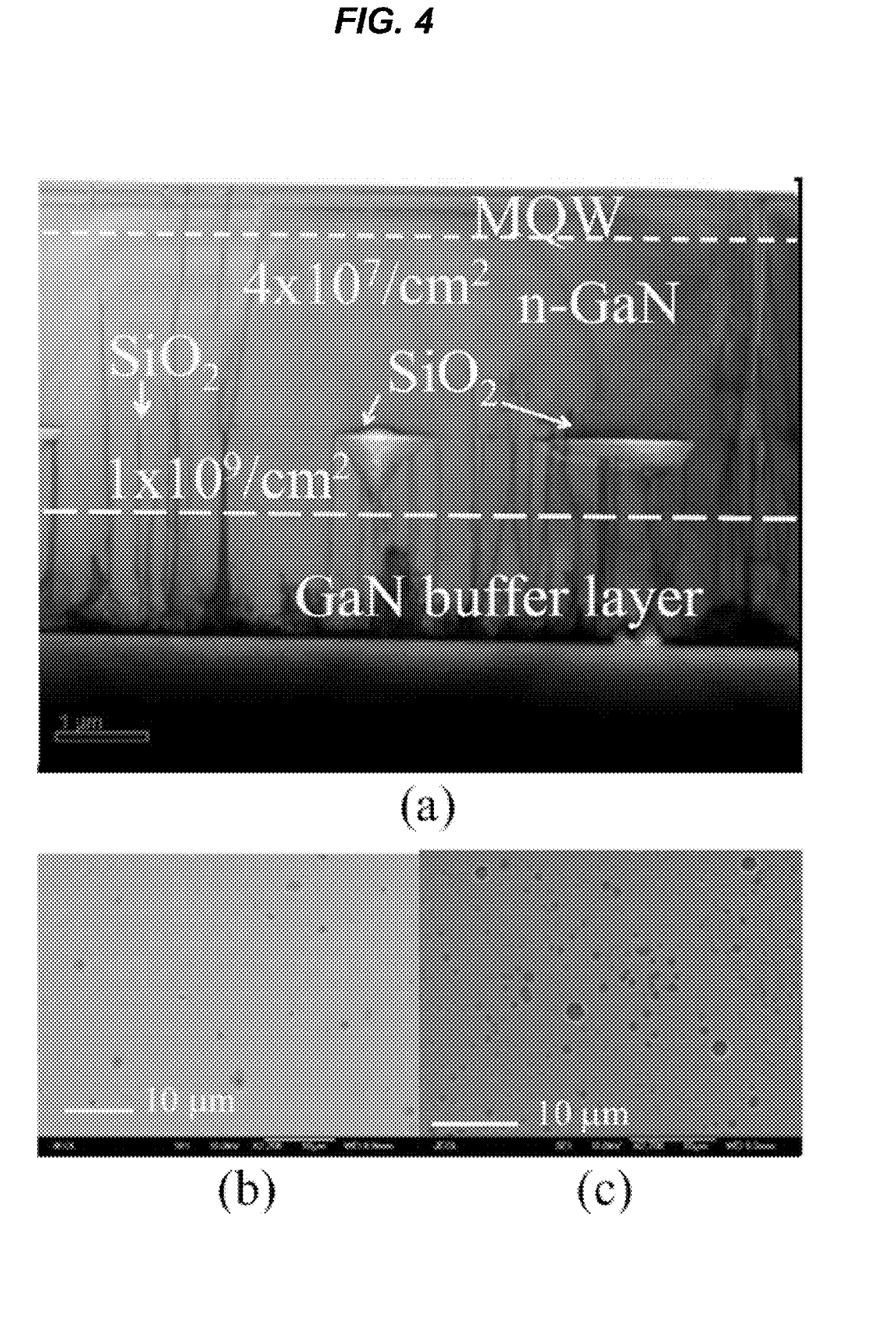

To assess the TD reduction, tunneling electron microscope TEM images are shown in FIG. 4. FIG. 4(a) shows the TEM image of a LED sample with defect selective passivation. The TD density can be estimated by directly counting the TD lines in the plane-view micrograph. The TD density estimated at the dashed line right below defect passivation layer is about $1\times10^9$ cm$^{-2}$. This number is slightly larger than the KOH etch pit density $5\times10^8$ cm$^{-2}$. The discrepancy is due to the fact that there can be multiple TDs under an etch pit as can be seen in FIG. 4(a). The TD density is significantly reduced to $4\times10^7$ cm$^{-2}$ at the dashed line near the QW region. SiO2 passivations at etched pits do effectively block the propagation of TDs. The SEM image however also shows that SiO2 fillings do not occur on top of all TDs. In other words, not all the TDs are etched by molten KOH and are exposed for passivation after the etching. As a result, some TDs are not blocked and propagate all the way to the top surface. Those TDs not etched by KOH are presumably specific types of TDs resistive to molten KOH etching. It has been reported that KOH preferentially etches screw type TD and is less effective in etching edge and mixed type TDs. To verify if those TDs propagating all the way to the top surface are resistive to KOH etching, the regrown sample was put in molten KOH under the same etching conditions again. The SEM image of the etched sample is shown in FIG. 4(b). There are much less etch pits, with density of only $1\times10^5$ cm$^{-2}$. The great reduction in etch pit density from $5\times10^8$ cm$^{-2}$ to $1\times10^5$ cm$^{-2}$ shows that the TDs that can be etched by KOH are mostly blocked by the SiO2 fillings in the defect selective passivation process. The etch pit density of $1\times10^5$ cm$^{-2}$ is much smaller than the TD density of $4\times10^7$ cm$^{-2}$ estimated from the cross section TEM image near surface region. Most of TDs not blocked by defect passivation process are those resistive to KOH etching. The sample was subsequently immersed in 195° C. H3PO4 solution for 20 min. KOH and H3PO4 have different preferential crystallographic etch planes. The surface SEM image after the etching is shown in FIG. 4(c). The H3PO4 etch pit morphology is very different from that of KOH etching. The etch pit density is about $1.2\times10^7$ cm$^{-2}$ which is close to the TD density estimated from the TEM image near surface region. This implies that KOH and H3PO4 somehow etches different defect types of TDs and both should probably be used to etch TDs in the defect selective etching process to increase defect passivation coverage.

Conducted tests on GaN samples demonstrate that SiO2 passivations at etch pits do effectively block the propagation of threading dislocations and significantly reduce the defect density. The defect passivation process can be applied to the substrate multiple times to provide multiple defect blocking and further reduce defect density. The defect passivated GaN substrate can be used to fabricate optoelectronic devices, e.g. light emitting diodes (LED) and UV to blue laser diodes, and offers much better device performances due its low defect density.

Figure 5:
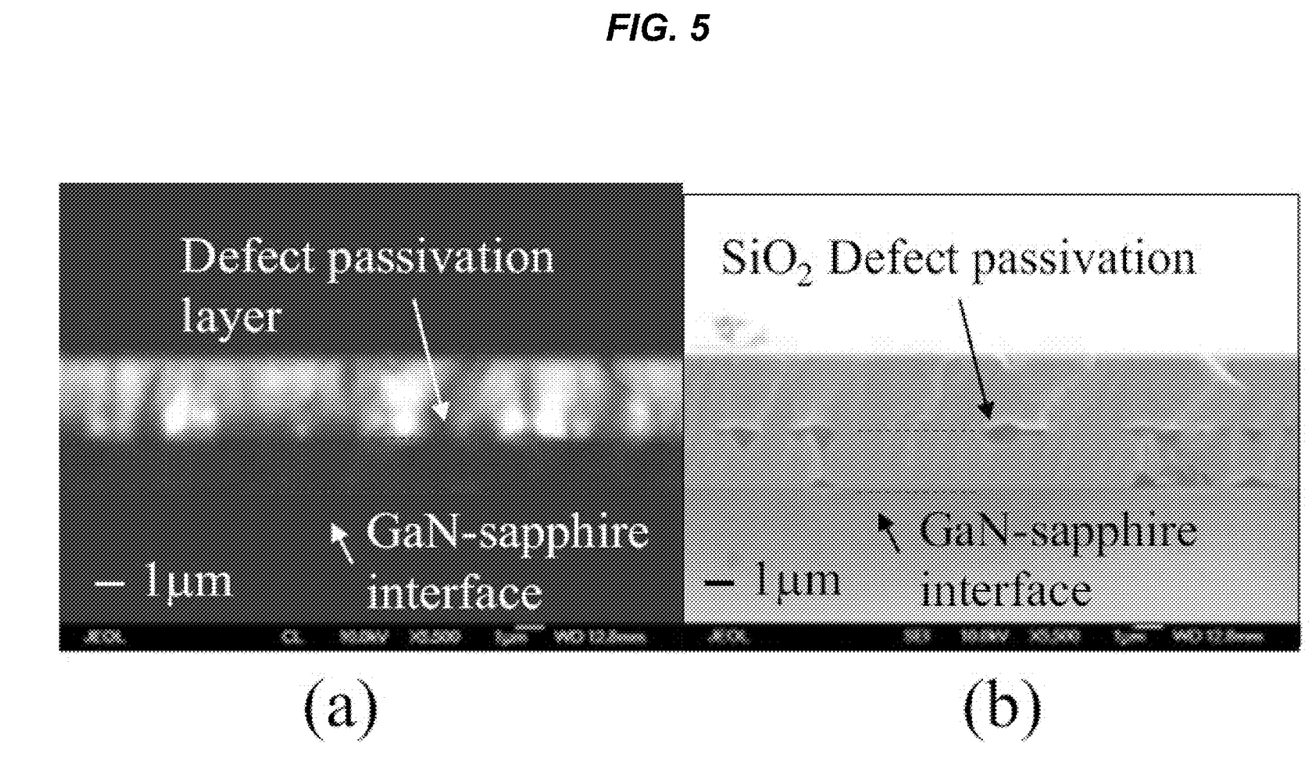

The optical characteristic is investigated by cathodoluminescent and SEM cross section images as shown in FIG. 5 which includes SEM images FIGS. 5(a) and 5(b). These two images are taken by switching detection mode from cathodoluminescent detection to scattering electron detection under the same magnification condition and thus have one to one location correspondence. The CL intensity changes dramatically across SiO2 passivation boundary. The bright CL spots are mostly located at the regrown GaN right on top of SiO2 passivation masks. The intensity of bright CL spot is so high that when it is adjusted not to saturate detector, the CL intensity difference between lower GaN layer and sapphire become visually hard to distinguish. By analyzing the gray scale levels of image pixels, GaN-sapphire interface can be identified and this identification is confirmed by comparing FIGS. 5(a) and 5(b). The CL intensity averaged over the cross section area of the regrown layer is measured to be about 23 times of that of the layer below passivation boundary. The threading dislocation defects are strong nonradiative recombination centers. The significant increase in CL intensity demonstrates that the loss of excited carriers due to nonradiative recombination is greatly reduced in the defect passivated layer as a result of the reduction in TD density.

Figure 6:
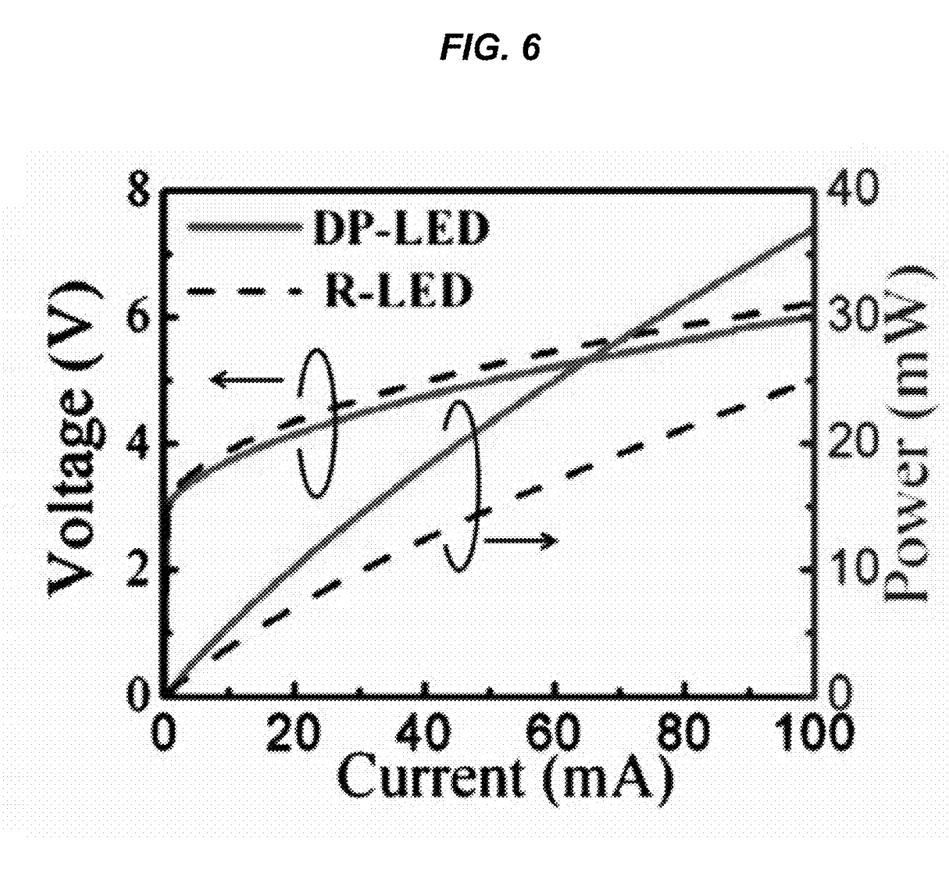

LED chips with size of 300×300 μm$^2$ were fabricated from the defect passivated epiwafer. The optical and electrical characteristics are compared with a reference LED going through the same fabrication process except for the defect passivation layer. The light-current L-I and voltage current V-I curves of the defect passivated LED (DP-LED) and un-passivated reference LED (R-LED) are shown in FIG. 6. The driving voltage of DP-LED shown in the solid line is slightly lower than the driving voltage shown by the dotted line of R-LED. This slightly lower driving voltage may be due to the lower defect density. When the defect density is lower, electrons are easier to move across material without scattering thus leading to lower resistance and driving voltage. The optical output power is however significantly enhanced by 45% compared to that of the reference sample at 20 mA. The SiO2 masks not only block the propagation of TD but also can act as light scattering sites to improve LED light extraction efficiency. A Monte Carlo ray tracing simulation is used to check if light extraction enhancement is a significant part of total output power enhancement. A simplified two-dimensional array of inverted hexagonal pyramid SiO2 masks is used to model the defect passivation. Various geometries with 0.7-1 m lateral size, 0.5-1 m height, and 3-4 m center to center spacing are calculated and show a variation of light extraction enhancement from 10%-25%. It shows that light extraction enhancement cannot be totally neglected in the total 45% output power enhancement. The output power enhancement from TD defect reduction is not as large as the above measured CL intensity enhancement. It has been reported that InGaN quantum well emission is less sensitive to TD defects. LEDs using GaN or AlGaN active layer is however very sensitive to TD defects and really requires the reduction of TD.

In summary, conducted tests on GaN samples demonstrated that the present defect selective passivation method can reduce TD density. The defect passivation SiO2 masks are self-aligned to the TD defect pits created by KOH defect selective etching without photolithography patterning and can significantly reduce TD density. The SiO2 masks also improve the light extraction efficiency in LED application.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A method for semiconductor fabrication, comprising:
growing a first semiconductor layer of a first semiconductor material on a substrate that is made of a substrate material different from the first semiconductor material;
etching a top surface of the first semiconductor layer to create one or more etch pits on the top surface extending into the first semiconductor layer, wherein one or more defects are present underneath each etch pit inside the first semiconductor layer;
depositing a passivation layer of a passivation material on the top surface to cover exposed areas of the top surface and the one or more etch pits to cover space above the one or more defects in each etch pit;
thinning down the passivation layer to remove some of the passivation material to expose at least part of the top surface while leaving the space above the one or more defects in each etch pit covered by the passivation layer; and
after the thinning down, growing the first semiconductor material or a semiconductor material compatible with the first semiconductor material over exposed areas of the first semiconductor layer to form a second semiconductor layer that covers the top surface and the one or more etch pits which are covered by the passivation layer to block extension of a defect in the first semiconductor layer into the second semiconductor layer.

2. The method as in claim 1, comprising:
forming one or more additional semiconductor layers over the second semiconductor layer.

3. The method as in claim 2, comprising:
patterning the one or more additional semiconductor layers over the second semiconductor layer to form semiconductor device structures.

4. The method as in claim 3, wherein:
the one or more additional semiconductor layers include a multiple quantum well structure.

5. The method as in claim 3, wherein:
the semiconductor device structures include light emitting diodes.

6. The method as in claim 3, wherein:
the substrate material is sapphire, silicon carbide, silicon, gallium arsenide, lithium gallate, or zinc oxide,
the first semiconductor material is a III-nitride material, and the passivation material is $SiO_2$, $Si_3N_4$, $TiO_2$, $Ta_2O_5$, $HfO_2$, $MgO2$, or $MgF_2$.

7. The method as in claim 6, wherein:
the semiconductor device structures include multiple quantum well structures.

8. The method as in claim 1, wherein:
the substrate material is sapphire,
the first semiconductor material is a III-nitride material,
the passivation material is $SiO_2$,
the growing of the first semiconductor layer and the second semiconductor layer uses a metalorganic chemical vapor deposition a process, and
the etching of top surface of the first semiconductor layer uses a chemical wet etching process.

9. The method as in claim 8, comprising:
using a molten or aqueous solution of KOH, $H_2SO_4$, $H_3PO_4$, HCl, or a mixture of two or more of KOH, $H_2SO_4$, $H_3PO_4$ and HCl, in the chemical wet etching process.

10. The method as in claim 1, wherein:
the etching of top surface of the first semiconductor layer uses a molten or aqueous solution of KOH, $H_2SO_4$, $H_3PO_4$, HCl, or a mixture of two or more of KOH, $H_2SO_4$, $H_3PO_4$ and HCl, in a chemical wet etching process.

11. The method as in claim 1, wherein:
the substrate material is sapphire, silicon carbide, silicon, gallium arsenide, lithium gallate, or zinc oxide.

12. The method as in claim 1, wherein:
the passivation material is $SiO_2$, $Si_3N_4$, $TiO_2$, $Ta_2O_5$, $HfO_2$, $MgO_2$, or $MgF_2$.

13. The method as in claim 1, wherein:
the passivation material is an amorphous material.

14. The method as in claim 1, wherein:
the first semiconductor material is a semiconductor that includes Ga and N.

15. The method as in claim 1, wherein:
the first semiconductor material is a semiconductor that includes N.

16. The method as in claim 1, wherein:
the thinning down of the passivation layer to remove some of the passivation material includes chemical mechanical polishing, inductively charged plasmas etching, or inductively charged plasma reactive ion etching.

17. A method for semiconductor fabrication, comprising:
growing a first semiconductor layer of a first semiconductor material that includes GaN on a substrate that is made of a substrate material different from the first semiconductor material;
applying a chemical wet etching process to etch a top surface of the first semiconductor layer in a molten or aqueous etching solution to create one or more etch pits on the top surface extending into the first semiconductor layer, wherein one or more defects are present underneath each etch pit inside the first semiconductor layer;
depositing a passivation layer of a passivation material on the top surface to cover exposed areas of the top surface and the one or more etch pits to cover space above the one or more defects in each etch pit;
thinning down the passivation layer to remove some of the passivation material to expose at least part of the top surface while leaving the space above the one or more defects in each etch pit covered by the passivation layer;
after the thinning down, growing the first semiconductor material or a semiconductor compatible with the first semiconductor material on exposed areas of the first semiconductor layer to form a second semiconductor layer that covers the top surface and the one or more etch pits which are covered by the passivation layer to block extension of a defect in the first semiconductor layer into the second semiconductor layer; and
forming one or more additional semiconductor layers over the second semiconductor layer.

18. The method as in claim 17, comprising:
patterning the one or more additional semiconductor layers over the second semiconductor layer to form semiconductor device structures.

19. The method as in claim 17, wherein:
the substrate material is sapphire, silicon carbide, silicon, gallium arsenide, lithium gallate, or zinc oxide.

20. The method as in claim 17, wherein:
the passivation material is $SiO_2$, $Si_3N_4$, $TiO_2$, $Ta_2O_5$, $HfO_2$, $MgO_2$, or $MgF_2$.

21. The method as in claim 17, wherein:
the passivation material is an amorphous material.

22. The method as in claim 17, wherein:
the molten or aqueous etching solution includes KOH, $H_2SO_4$, $H_3PO_4$, HCl, or a mixture of two or more of KOH, $H_2SO_4$, $H_3PO_4$ and HCl.

23. The method as in claim 17, wherein:
the thinning down of the passivation layer to remove some of the passivation material includes chemical mechanical polishing, inductively charged plasmas etching, or inductively charged plasma reactive ion etching.

* * * * *